(12) United States Patent
Yamatsu (10) Patent No.: US 7,809,273 B2
(45) Date of Patent: Oct. 5, 2010

(54) TRANSMISSION TECHNIQUE IN SYSTEM INCLUDING CHAMBER

(75) Inventor: Yasuyoshi Yamatsu, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1094 days.

(21) Appl. No.: 10/976,881

(22) Filed: Nov. 1, 2004

(65) Prior Publication Data

US 2005/0105903 A1   May 19, 2005

(30) Foreign Application Priority Data

Nov. 13, 2003   (JP) ............................. 2003-383316

(51) Int. Cl.
  *H04B 10/00*  (2006.01)
  *H04J 14/02*  (2006.01)
(52) U.S. Cl. ........................................ 398/110; 398/79
(58) Field of Classification Search .................. 398/79, 398/43
See application file for complete search history.

(56) References Cited

U.S. PATENT DOCUMENTS

| | | | | |
|---|---|---|---|---|
| 5,448,390 | A | | 9/1995 | Tsuchiya et al. ............ 359/132 |
| 5,719,495 | A | * | 2/1998 | Moslehi .................... 324/158.1 |
| 5,721,794 | A | * | 2/1998 | Uchiyama et al. ............. 385/19 |
| 5,859,717 | A | * | 1/1999 | Scobey et al. ................. 398/79 |
| 6,043,917 | A | * | 3/2000 | Sonderegger et al. ........ 359/285 |
| 6,516,534 | B2 | * | 2/2003 | Chen et al. .................... 33/706 |
| 6,661,974 | B1 | * | 12/2003 | Akiyama et al. ............... 398/95 |
| 6,838,688 | B2 | * | 1/2005 | Aoki ...................... 250/559.29 |
| 6,963,679 | B1 | * | 11/2005 | Novotny et al. ............... 385/18 |
| 7,184,670 | B2 | * | 2/2007 | Townsend .................... 398/169 |
| 2002/0145113 | A1 | * | 10/2002 | Sullivan et al. ............. 250/311 |
| 2004/0113104 | A1 | * | 6/2004 | Maida, Jr. .................... 250/573 |

FOREIGN PATENT DOCUMENTS

| JP | 6-265746 | 9/1994 |
|---|---|---|
| JP | 10-050497 | 2/1998 |

* cited by examiner

*Primary Examiner*—Shi K Li
(74) *Attorney, Agent, or Firm*—Fitzpatrick, Cella, Harper & Scinto (57) ABSTRACT

A system is provided including a chamber having an internal environment different from an external environment. The chamber includes a transmission line, disposed through a partition wall of the chamber, for transmitting an electromagnetic wave therethrough. A plurality of generators, disposed outside the chamber, are included for generating electromagnetic waves for measurement, and a first multiplex/demultiplex unit is disposed outside the chamber for multiplexing a plurality of electromagnetic waves from the plurality of generators and sending a multiplexed electromagnetic wave to the transmission line and demultiplexing a multiplexed electromagnetic wave received from the transmission line. A second multiplex/demultiplex unit is disposed inside the chamber for multiplexing a plurality of electromagnetic waves and sending a multiplexed electromagnetic wave to the transmission line and demultiplexing a multiplexed electromagnetic wave received from the transmission line. A plurality of measurement units are disposed inside the chamber for directing electromagnetic waves received from the second multiplex/demultiplex unit to to-be-measured regions and sending electromagnetic waves from the to-be-measured regions to the second multiplex/demultiplex unit.

9 Claims, 5 Drawing Sheets

TRANSMISSION TECHNIQUE IN SYSTEM INCLUDING CHAMBER

This application claims priority from Japanese Patent Application No. 2003-383316, entitled "CHAMBER APPARATUS, SEMICONDUCTOR MANUFACTURING APPARATUS, AND DEVICE MANUFACTURING METHOD" and filed Nov. 13, 2003, the entire contents of which are incorporated herein by reference.

BACKGROUND OF THE INVENTION

1. Field of the Invention

The present invention relates to a technique, in a system including a chamber serving to maintain an environment different from an external environment, for transmitting a signal between the inside and outside of the chamber. Such a chamber may be, for example, a purge chamber filled with an inert gas inside, or a vacuum chamber. Further, the present invention relates to a device manufacturing apparatus and method applied with such a transmission technique.

2. Description of the Related Art

As semiconductor manufacturing apparatuses, there are known a type having a purge chamber filled with an inert gas inside and a type having a vacuum chamber under negative pressure inside. When transmitting a signal between the inside and outside of the chamber in each of those types of semiconductor manufacturing apparatuses, a feedthrough portion is usually provided at a wall of the chamber and the transmission is carried out through it, thereby preventing leakage of the inert gas inside the chamber to the outside or preventing reduction of the degree of vacuum inside the chamber.

To give an example, in a semiconductor manufacturing apparatus described in JP-A H10-50497, a feedthrough portion is provided at a wall of a vacuum chamber for transmitting therethrough an electrical signal of a probe disposed in the vacuum chamber to the outside thereof. To give a further example, there is also known a semiconductor manufacturing apparatus using optical fibers as signal transmission lines wherein a light emitted by a laser disposed outside a vacuum chamber is introduced into the vacuum chamber through an optical fiber so as to be used for a given measurement and a detected measurement light is guided out to the outside of the vacuum chamber through another optical fiber. In recent years, as semiconductor manufacturing apparatuses have been becoming more complicated and increasing in scale, more units have been installed inside a chamber and, therefore, the number of feedthrough portions for connecting between the inside and outside of the chamber has been increasing.

On the other hand, as a communication technique using optical fibers, there is known, for example, a technique of wavelength division multiplex communication that multiplexes lights having different wavelengths by a multiplexer/demultiplexer to carry out two-way communication through one optical cable (e.g., see JP-A H06-265746).

In general, the chambers of those semiconductor manufacturing apparatuses are required to be very strong in structure because if it is a purge chamber that is filled with an inert gas inside, it should prevent leakage of the purge gas, while, if it is a vacuum chamber, it should ensure a vacuum inside. Therefore, a very large area in the partition wall of the chamber is required only for transmitting one signal through the feedthrough portion. Under these circumstances, there is a problem that if the number of transmission signals is increased, feedthrough portions are required at the wall of the chamber as many as the number of the signals, thereby causing an increase in size and price of the apparatus.

Further, there is also a problem that the degree of inert gas purity or vacuum inside the chamber is lowered due to the influence of outgas discharged from a feedthrough connector so that impurities are mixed into a semiconductor to be manufactured, thereby reducing the yield of semiconductor elements.

SUMMARY OF THE INVENTION

The present invention has been made in consideration of the prior art disadvantages a described above and has an exemplified object to reduce the number of transmission lines that extend through a partition wall of a chamber.

In order to accomplish the foregoing object, the present invention has the following modes.

Specifically, according to the present invention, the foregoing object is attained by providing a system including a chamber having an internal environment different from an external environment, the system comprising a transmission line, disposed through a partition wall of the chamber, for transmitting an electromagnetic wave therethrough; a first multiplex/demultiplex unit, disposed outside the chamber, for multiplexing a plurality of electromagnetic waves and sending a multiplexed electromagnetic wave to the transmission line and demultiplexing a multiplexed electromagnetic wave received from the transmission line; and a second multiplex/demultiplex unit, disposed inside the chamber, for multiplexing a plurality of electromagnetic waves and sending a multiplexed electromagnetic wave to the transmission line and demultiplexing a multiplexed electromagnetic wave received from the transmission line.

Further, the foregoing object is also attained by providing a system including a chamber having an internal environment different from an external environment, the system comprising a transmission line, disposed through a partition wall of the chamber, for transmitting an electromagnetic wave therethrough; a plurality of generators, disposes outside the chamber, for generating electromagnetic waves for measurement, respectively; a first multiplex/demultiplex unit, disposed outside the chamber, for multiplexing a plurality of electromagnetic waves from the plurality of generators and sending a multiplexed electromagnetic wave to the transmission line and demultiplexing a multiplexed electromagnetic wave received from the transmission line; a second multiplex/demultiplex unit, disposed inside the chamber, for multiplexing a plurality of electromagnetic waves and sending a multiplexed electromagnetic wave to the transmission line and demultiplexing a multiplexed electromagnetic wave received from the transmission line; and a plurality of measurement units, disposed inside the chamber, for directing electromagnetic waves received from the second multiplex/demultiplex unit to to-be-measured regions and sending electromagnetic waves from the to-be-measured regions to the second multiplex/demultiplex unit, respectively.

According to the present invention, the number of the transmission lines that extend through the partition wall of the chamber can be reduced.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Figure 1:
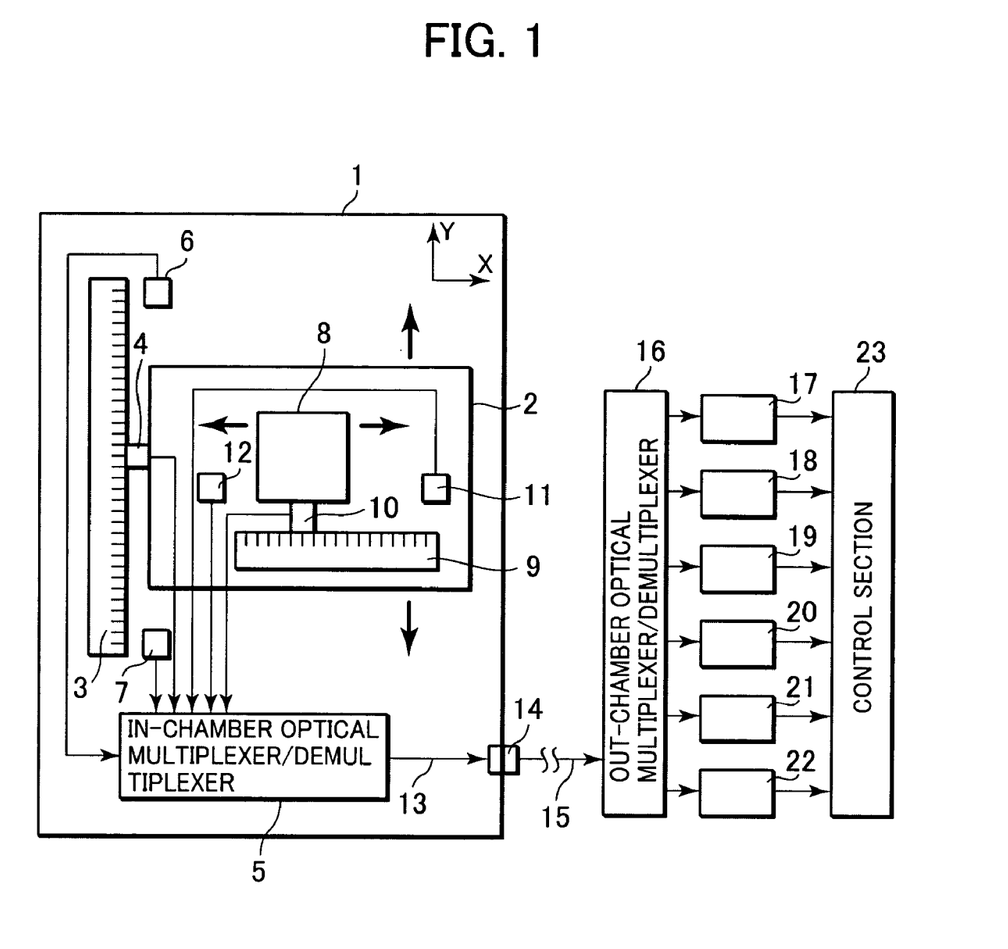
FIG. 1 is a schematic diagram showing the state, as seen from above, of a semiconductor manufacturing apparatus according to a preferred embodiment of the present invention.

FIG. 1 is a schematic diagram showing the state, as seen from above, of a semiconductor manufacturing apparatus according to a preferred embodiment of the present invention. In FIG. 1, numeral 1 denotes a chamber of the semiconductor manufacturing apparatus, and 2 a Y-stage disposed inside the chamber 1. The Y-stage 2 is movable in a Y-direction by a Y-axis drive mechanism (not illustrated).

Numeral 3 denotes a linear scale fixed to an inner surface of the chamber 1 for measuring a Y-direction position of the Y-stage 2, 4 a detector fixed to the Y-stage 2 for outputting a Y-direction position signal indicative of the Y-direction position of the Y-stage 2 by being displaced relative to the Y-direction linear scale 3, 6 a Y-direction plus-side limit sensor for outputting a Y-direction plus-side limit signal by detecting that the Y-stage 2 has moved to a drive limit position in a plus Y-direction, and 7 a Y-direction minus-side limit sensor for outputting a Y-direction minus-side limit signal by detecting that the Y-stage 2 has moved to a drive limit position in a minus Y-direction. Numeral 5 denotes an in-chamber optical multiplexer/demultiplexer having functions of multiplexing the Y-direction position signal, the Y-direction plus-side limit signal, the Y-direction minus-side limit signal, and so forth, the Y-direction minus-side limit signal, and so forth, sending out a multiplexed signal to the outside of the chamber 1, and so forth.

Numeral 8 denotes an X-stage disposed on the Y-stage 2 and being movable in an X-direction by an X-axis drive mechanism (not illustrated), and 9 a linear scale fixed on the Y-stage 2 for measuring an X-direction position of the X-stage 8. Numeral 10 denotes a detector fixed to the X-stage 8 for outputting an X-direction position signal indicative of the X-direction position of the X-stage 8 by being displaced relative to the X-direction linear scale 9, 11 an X-direction plus-side limit sensor for outputting an X-direction plus-side limit signal by detecting that the X-stage 8 has moved to a drive limit position in a plus X-direction, and 12 an X-direction minus-side limit sensor for outputting an X-direction minus-side limit signal by detecting that the X-stage 8 has moved to a drive limit position in a minus X-direction. The X-direction position signal, the X-direction plus-side limit signal, and the X-direction minus-side limit signal are sent to the in-chamber optical multiplexer/demultiplexer 5 where these signals are multiplexed along with the Y-direction position signal, the Y-direction plus-side limit signal, and the Y-direction minus-side limit signal.

Numeral 13 denotes an in-chamber transmission line composed of one optical fiber for transmitting the information multiplexed by the in-chamber optical multiplexer/demultiplexer 5, and 14 a feedthrough portion provided at a partition wall of the chamber 1. The feedthrough portion 14 has a strong structure that can prevent leakage of an inert gas inside the chamber 1 to the outside or reduction of the degree of vacuum inside the chamber 1.

Numeral 15 denotes an out-chamber transmission line composed of one optical fiber for transmitting the signal having passed through the feedthrough portion 14, 16 an out-chamber optical multiplexer/demultiplexer for dividing the multiplexed signal from the in-chamber optical multiplexer/demultiplexer 5 into the original individual signals, 17 a signal processing section for the Y-direction plus-side limit signal divided and selected by the out-chamber optical multiplexer/demultiplexer 16, 18 a signal processing section for the Y-direction minus-side limit signal selected in a like manner, 19 a signal processing section for the X-direction plus-side limit signal selected in a like manner, 20 a signal processing section for the X-direction minus-side limit signal selected in a like manner, 21 a signal processing section for the Y-direction position signal selected in a like manner, and 22 a signal processing section for the X-direction position signal selected in a like manner.

Numeral 23 denotes a control section of the semiconductor manufacturing apparatus. The control section 23 is capable of driving the non-illustrated Y-axis drive mechanism and X-axis drive mechanism based on processing result information from the signal processing section 17 to the signal processing section 22 to thereby carry out positioning of the Y-stage 2 and the X-stage 8 at predetermined positions.

Figure 2:
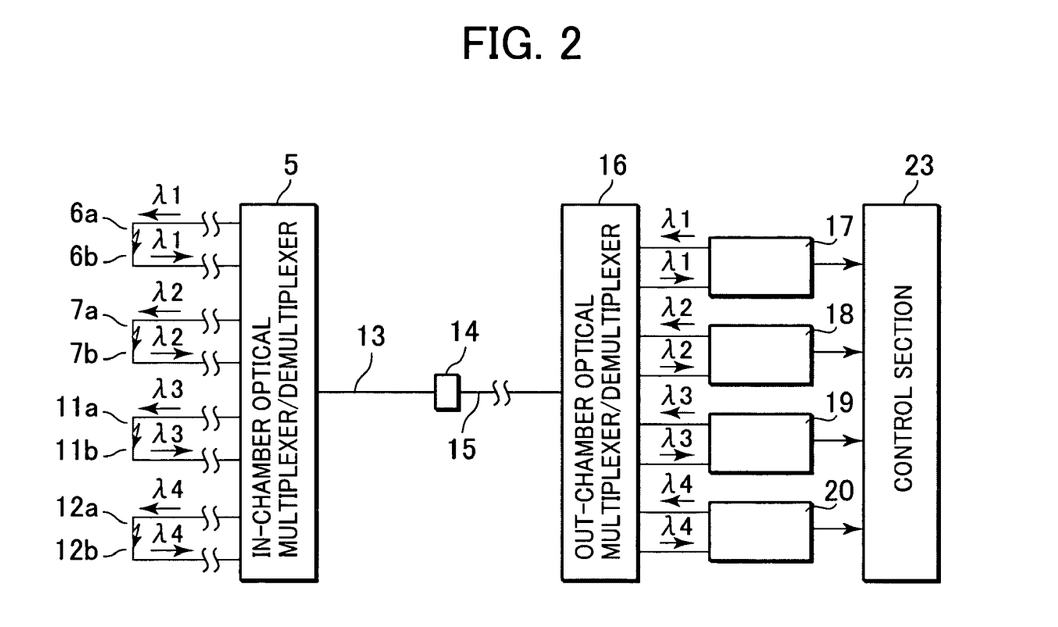
FIG. 2 is a detailed block diagram for explaining structures of limit sensors and roles of optical multiplexers/demultiplexers in the semiconductor manufacturing apparatus in FIG. 1.

FIG. 2 is a block diagram for explaining structures of the respective limit sensors 6, 7, 11, and 12 and roles, related to them, of the respective optical multiplexers/demultiplexers 5 and 16. As shown in the figure, the signal processing section 17 to 20 can feed lights respectively having wavelengths $\lambda 1$, $\lambda 2$, $\lambda 3$, and $\lambda 4$ to the out-chamber optical multiplexer/demultiplexer 16. The wavelengths $\lambda 1$, $\lambda 2$, $\lambda 3$, and $\lambda 4$ slightly differ from one another. The out-chamber optical multiplexer/demultiplexer 16 and the in-chamber optical multiplexer/demultiplexer 5 are each the same element as the multiplexer/demultiplexer used in the foregoing conventional wavelength division multiplex communication. The combination of both optical multiplexers/demultiplexers 5 and 16 makes it possible to multiplex the lights of the wavelengths $\lambda 1$, $\lambda 2$, $\lambda 3$, and $\lambda 4$ and transmit a multiplexed light through the transmission lines 13 and 15 to demultiplex the multiplexed light to extract the original lights of the wavelengths $\lambda 1$, $\lambda 2$, $\lambda 3$, and $\lambda 4$, in two ways.

Symbols 6a and 6b denote a light-projecting portion and a light-receiving portion of the Y-direction plus-side limit sensor 6, respectively. The light-projecting portion 6a and the light-receiving portion 6b are formed by two optical fibers for introducing the light of wavelength $\lambda 1$ extracted by demultiplexing at the in-chamber optical multiplexer/demultiplexer 5 into the Y-direction plus-side limit sensor 6 and for guiding it out therefrom. The introduced light is projected from an end portion of the guide-in side optical fiber at the light-projecting portion 6a and received at an end portion of the guide-out side optical fiber at the light-receiving portion 6b. When the Y-stage 2 has not reached the position of the Y-direction plus-side limit sensor 6, the light projected from the light-projecting portion 6a is received at the light-receiving portion 6b, then multiplexed with other lights at the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15.

When the light of wavelength $\lambda 1$ is included in the received light, the out-chamber optical multiplexer/demultiplexer 16 extracts the light of wavelength $\lambda 1$ and sends it to the signal processing section 17. The signal processing section 17 judges whether or not the light of wavelength $\lambda 1$, which was sent out, has returned and, if positive, it sends to the control section 23 information indicating that the Y-stage 2 has not reached the position of the Y-direction plus-side limit sensor 6.

Symbols 7a and 7b denote a light-projecting portion and a light-receiving portion of the Y-direction minus-side limit sensor 7, respectively. The light-projecting portion 7a and the light-receiving portion 7b are formed by two optical fibers for introducing the light of wavelength $\lambda 2$ extracted at the in-chamber optical multiplexer/demultiplexer 5 into the Y-direction minus-side limit sensor 7 and for guiding it therefrom. The introduced light is projected from an end portion of the guide-in side optical fiber at the light-projecting portion 7a and received at an end portion of the guide-out side optical fiber at the light-receiving portion 7b. When the Y-stage 2 has not reached the position of the Y-direction minus-side limit sensor 7, the light projected from the light-projection portion 7a is received at the light-receiving portion 7b, then multiplexed with other lights at the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15.

When the light of wavelength $\lambda 2$ is included in the received light, the out-chamber optical multiplexer/demultiplexer 16 extracts the light of wavelength $\lambda 2$ and sends it to the signal processing section 18. The signal processing section 18 judges whether or not the light of wavelength $\lambda 2$, which was sent out, has returned and, if positive, it sends to the control section 23 information indicating that the Y-stage 2 has not reached the position of the Y-direction minus-side limit sensor 7.

Symbols 11a and 11b denote a light-projecting portion and a light-receiving portion of the X-direction plus-side limit sensor 11, respectively. The light-projecting portion 11a and the light-receiving portion 11b are formed by two optical fibers for introducing the light of wavelength $\lambda 3$ extracted at the in-chamber optical multiplexer/demultiplexer 5 into the X-direction plus-side limit sensor 11 and for guiding it therefrom. The introduced light is projected from an end portion of the guide-in side optical fiber at the light-projecting portion 11a and received at an end portion of the guide-out side optical fiber at the light-receiving portion 11b. When the X-stage 8 has not reached the position of the X-direction plus-side limit sensor 11, the light projected from the light-projecting portion 11a is received at the light-receiving portion 11b, then multiplexed with other lights at the in-chamber optical multiplexer/demultiplexer 5 and sent, along with the other lights, to the out-chamber optical multiplexer/demultiplexer 16 through the in-chamber transmission line 13, and feedthrough portion 14, and the out-chamber transmission line 15.

When the light of wavelength $\lambda 3$ is included in the received light, the out-chamber optical multiplexer/demultiplexer 16 extracts the light of wavelength $\lambda 3$ and sends it to the signal processing section 19. The signal processing section 19 judges whether or not the light of wavelength $\lambda 3$, which was sent out, has returned and, if positive, it sends to the control section 23 information indicating that the X-stage 8 has not reached the position of the X-direction plus-side limit sensor 11.

Symbols 12a and 12b denote a light-projecting portion and a light-receiving portion of the X-direction minus-side limit sensor 12, respectively. The light-projecting portion 12a and the light-receiving portion 12b are formed by two optical fibers for introducing the light of wavelength $\lambda 4$ extracted at the in-chamber optical multiplexer/demultiplexer 5 into the X-direction minus-side limit sensor 12 and for guiding it out therefrom. The introduced light is projected from an end portion of the guide-in side optical fiber at the light-projecting portion 12a and received at an end portion of the guide-out side optical fiber at the light-receiving portion 12b. When the X-stage 8 has not reached the position of the X-direction minus-side limit sensor 12, the light projected from the light-projecting portion 12a is received at the light-receiving portion 12b, then multiplexed with other lights at the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15.

When the light of wavelength $\lambda 4$ is included in the received light, the out-chamber optical multiplexer/demultiplexer 16 extracts the light of wavelength $\lambda 4$ and sends it to the signal processing section 20. The signal processing section 20 judges whether or not the light of wavelength $\lambda 4$, which was sent out, has returned and, if positive, it sends to the control section 23 information indicating that the X-stage 8 has not reached the position of the X-direction minus-side limit sensor 12.

Figure 3:
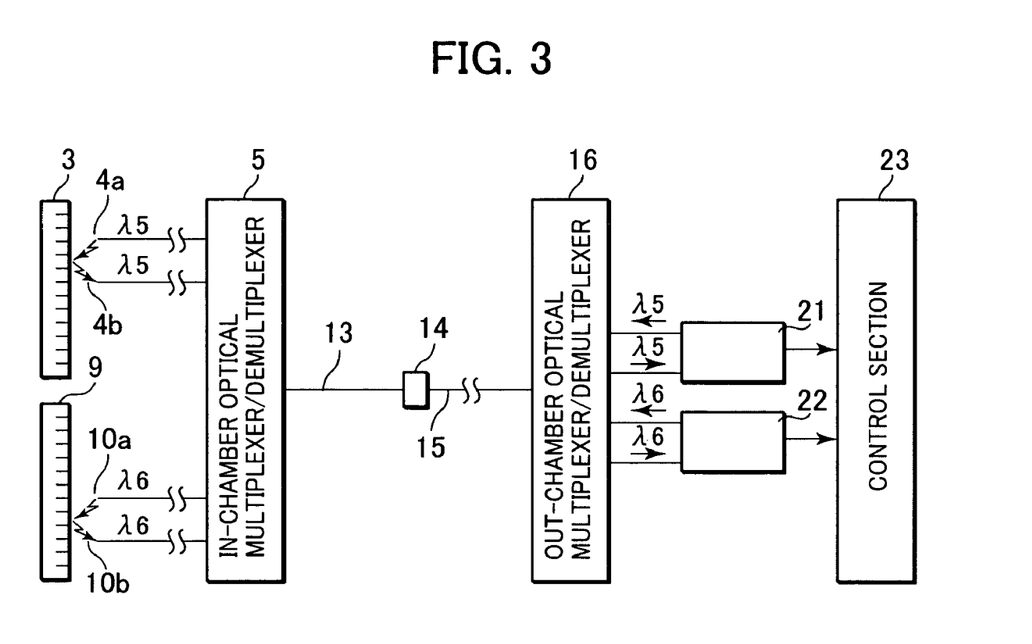
FIG. 3 is a detailed block diagram for explaining structures of linear scales and roles of the optical multiplexers/demultiplexers in the semiconductor manufacturing apparatus in FIG. 1.

FIG. 3 is a block diagram for explaining structures of the linear scales 3 and 9 and the detectors 4 and 10 and roles, related to them, of the respective optical multiplexers/demultiplexers 5 and 16. As shown in the figure, the position signal processing section 21 can feed a light having a wavelength $\lambda 5$ to the out-chamber optical multiplexer/demultiplexer 16, while the position signal processing section 22 can feed a light having a wavelength $\lambda 6$ slightly different from wavelength $\lambda 5$ to the out-chamber optical multiplexer/demultiplexer 16.

As described in relation to FIG. 2, the out-chamber optical multiplexer/demultiplexer 16 and the in-chamber optical multiplexer/demultiplexer 5, when combined, make it possible to multiplex the lights having the different wavelengths $\lambda 5$ and $\lambda 6$ and transmit a multiplexed light through one optical fiber and then to extract the original lights of wavelength $\lambda 5$ and wavelength $\lambda 6$ by demultiplexing, in two ways.

Symbols 4a and 4b denote a light-projecting portion and a light-receiving portion of the detector 4, respectively. The light-projecting portion 4a and the light-receiving portion 4b are formed by two optical fibers for introducing the light of wavelength $\lambda 5$ extracted at the in-chamber optical multiplexer/demultiplexer 5 into the detector 4 and for guiding it out therefrom. The introduced light is projected from an end portion of the guide-in side optical fiber at the light-projecting portion 4a and received at an end portion of the guide-out side optical fiber at the light-receiving portion 4b.

The light of wavelength $\lambda 5$ form the light-projecting portion 4a is reflected by the linear scale 3 having a surface on which graduations adapted to reflect or absorb the light are engraved, and is received at the light-receiving portion 4b, then multiplexed with other lights at the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15. When the light of wavelength λ5 is included in the received light the out-chamber optical multiplexer/demultiplexer 16 extracts the light of wavelength λ5 and sends it to the position signal processing section 21. The position signal processing section 21 can detect the position of the Y-stage 2 by counting pulses, or the like, of the light of wavelength λ5 having returned with its light intensity in the form of pulses or sinewaves, and send this position information to the control section 23.

Symbols 10a and 10b denote a light-projecting portion and a light-receiving portion of the detector 10, respectively. The light-receiving portion 10a and the light-receiving portion 10b are formed by two optical fibers for introducing the light of wavelength λ6 demultiplexed at the in-chamber optical multiplexer/demultiplexer 5 into the detector 10 and for guiding it out therefrom. The introduced light is projected from an end portion of the guide-in side optical fiber at the light-projecting portion 10a and received at an end portion of the guide-out side optical fiber at the light-receiving portion 10b.

The light of wavelength λ6 from the light-projecting portion 10a is reflected by the linear scale 9 having a surface on which graduations adapted to reflect or absorb the light are engraved, and received at the light-receiving portion 10b, the multiplexed with other lights at the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15. When the light of wavelength λ6 is included in the received light, the out-chamber optical multiplexer/demultiplexer 16 extracts the light of wavelength λ6 and sends it to the position signal processing section 22. The position signal processing section 22 can detect the position of the X-stage 8 by counting pulses, or the like, of the light of wavelength λ6 having returned with its light intensity in the form of pulses or sinewaves, and send this position information to the control section 23.

Now, a description will be given of a method of controlling the Y-stage 2 and the X-stage 8 in the foregoing structure. In order to control the Y-stage 2, the control section 23 first confirms the state of the Y-direction plus-side limit sensor 6 and the state of the Y-direction minus-side limit sensor 7 and determines the direction in which the Y-stage 2 is allowed to move. Specifically, first, the signal processing sections 17 and 18 feed a light of wavelength λ1 and a light of wavelength λ2 to the out-chamber optical multiplexer/demultiplexer 16. The lights of wavelengths λ1 and λ2 are multiplexed with each other by the out-chamber optical multiplexer/demultiplexer 16 and sent to the in-chamber optical multiplexer/demultiplexer 5 through the out-chamber transmission line 15, the feedthrough portion 14, and the in-chamber transmission lien 13, then demultiplexed into the original optical signals of wavelengths λ1 and λ2 by the in-chamber optical multiplexer/demultiplexer 5. The demultiplexed light of wavelength λ1 is projected from the light-projecting portion 6a of the Y-direction plus-side limit sensor 6, while the demultiplexed light of wavelength λ2 is projected from the light-projection portion 7a of the Y-direction minus-side limit sensor 7.

The projected light of wavelength λ1 is received at the light-receiving portion 6b when the Y stage 2 has not reached the position of the Y-direction plus-side limit sensor 6. On the other hand, the projected light of wavelength λ2 is received at the light-receiving portion 7b when the Y-stage 2 has not reached the position of the Y-direction minus-side limit sensor 7. The received lights of wavelengths λ1 and λ2 are multiplexed with other lights by the in-chamber optical multiplexer/demultiplexer 5 and sent, along with the other lights, to the out-chamber optical multiplexer/demultiplexer 16 through the in-chamber transmission line 13, the feedthrough portion 14, and the out-chamber transmission line 15.

When the light of wavelength λ1 is included in the received light, the out-chamber optical multiplexer/demultiplexer 16 extracts the light of wavelength λ1 and sends it to the signal processing section 17. On the other hand, when the light of wavelength λ2 is included in the received light, the out-chamber optical multiplexer/demultiplexer 16 extract the light of wavelength λ2 and sends it to the signal processing section 18. Then, the signal processing section 17 judges whether or not the light of wavelength λ1, which was sent out a described above, has returned and, if positive, it sends to the control section 23 information indicating that the Y-stage 2 has not reached the position of the Y-direction minus-side limit sensor 7. Based on this information, the control section 23 can determine a drive direction so that the Y-stage 2 does not exceed either limit. Then, the control section 23 moves the Y-stage 2 to the Y-direction plus-side limit sensor 6 by the use of the non-illustrated Y-axis drive mechanism.

This makes the position of the Y-stage 2 definite. Accordingly, thereafter, it is possible to move the Y-stage 2 to a desired position based on information about the linear scale 3 from the detector 4. Specifically, first, the signal processing section 21 feeds a light of wavelength λ5 to the out-chamber optical multiplexer/demultiplexer 16. This light of wavelength λ5 is multiplexed with other lights by the out-chamber optical multiplexer/demultiplexer 16 and transmitted to the in-chamber optical multiplexer/demultiplexer 5 through the out-chamber transmission line 15, the feedthrough portion 14, and the in-chamber transmission line 13, then demultiplexed into the original optical signal of wavelength λ5 by the in-chamber optical multiplexer/demultiplexer 5. The demultiplexed light of wavelength λ5 is projected toward the linear scale 3 from the light projecting portion 4a of the detector 4.

In this event, since the graduations, which reflect or absorb the light, are engraved on the surface of the linear scale 3, the presence and absence of light reception of the light of wavelength λ5 are repeated at the light-receiving portion 4b following the movement of the Y-stage 2. In case of the presence of the light reception, the received light is multiplexed with other lights by the in-chamber optical multiplexer/demultiplexer 5 and sent to the out-chamber optical multiplexer/demultiplexer 16 through the in-chamber transmission line 13, the feedthrough portion 14, and the out-chamber transmission line 15. The out-chamber optical multiplexer/demultiplexer 16 demultiplexes the received light to extract the light of wavelength λ5 and sends it to the position signal processing section 21. The position signal processing section 21 detects the position of the Y-stage 2 by counting repetitions of pulses or sinewaves of the light of wavelength λ5 having returned with its light intensity in the pulse or sinewave from, and sends this information to the control section 23. Based on this information, the control section 23 controls the Y-stage 2.

A control method for the X-stage 8 is the same as the foregoing control method for the Y-stage 2 except that the linear scale 9, the detector 10, the X-direction plus-side limit sensor 11, the X-direction minus-side limit sensor 12, and the X-axis drive mechanism are used instead of the linear scale 3, the detector 4, the Y-direction plus-side limit sensor 6, the Y-direction minus-side limit sensor 7, and the Y-axis drive mechanism. Specifically, the direction in which the X-stage 8 is allowed to move is determined by the use of the X-direction plus-side limit sensor 11 and the X-direction minus-side limit sensor 12, then the X-stage 8 is moved to the X-direction plus-side limit sensor 11 by the X-axis drive mechanism. Thereafter, the position of the X-stage 8 is detected by counting pulses or sinewaves of a light of wavelength $\lambda 6$ output from the detector 10 according to the movement of the X-stage 8 along the linear scale 9, thereby controlling the X-stage 8.

Figure 4:
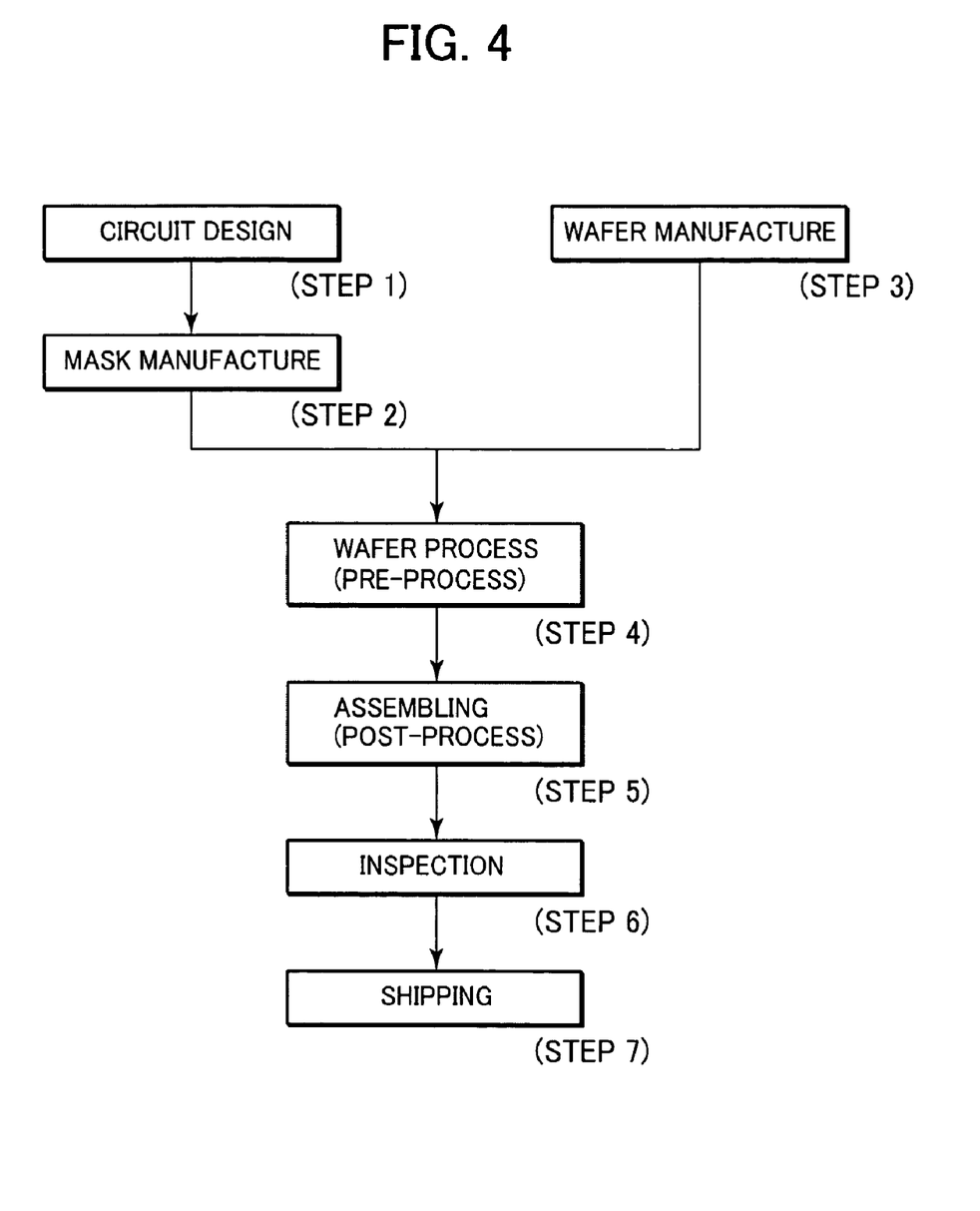
FIG. 4 is a flowchart of manufacturing processes for manufacturing semiconductor devices.

Now, a description will be given of processes of manufacturing a semiconductor device by the use of the semiconductor manufacturing apparatus as described above. FIG. 4 shows the flow of the entire manufacturing processes for the semiconductor device. In step 1 (circuit design), a circuit design for the semiconductor device is carried out. In step 2 (mask manufacture), a mask formed with designed circuit patterns is produced. On the other hand, in step 3 (wafer manufacture), a wafer is produced using a material such as silicon. Step 4 (wafer process) is called a pre-process, wherein, using the produced mask and wafer, actual circuits are formed on the wafer according to the lithography technique. The next step, step 5 (assembling), is called a post-process which is a process of forming semiconductor chips by the use of the wafer obtained in step 4 and includes assembling processes such as an assembly process (dicing and bonding) and a packaging process (chip sealing). In step 6 (inspection), inspections such as an operation confirmation test and a durability test are carried out for the semiconductor devices manufactured in step 5. The semiconductor devices are completed through these processes and then shipped (step 7). The pre-process and the post-process are carried out in dedicated separate factories, respectively, and maintenance is performed for each of these factories by a remote maintenance system. Further, between the pre-process factory and the post-process factory, data communication is carried out for exchanging information about production management and apparatus maintenance through the Internet or a private-line network.

Figure 5:
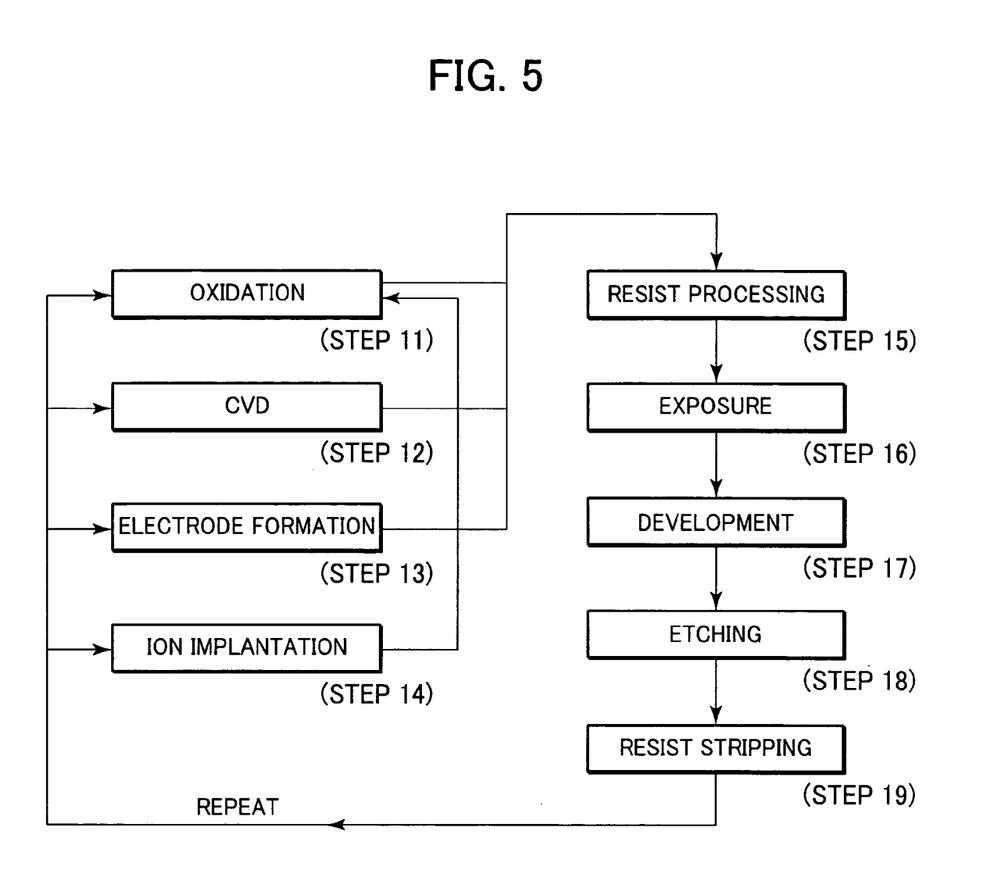
FIG. 5 is a flowchart of a wafer process in FIG. 4.

FIG. 5 shows the detailed flow of the foregoing wafer process. In step 11 (oxidation), the surface of the wafer is oxidized. In step 12 (CVD), an insulating film is formed on the surface of the wafer. In step 13 (electrode formation), electrodes are formed on the wafer by vapor deposition. In step 14 (ion implantation), ions are implanted into the wafer. In step 15 (resist processing), a sensitive material is applied to the wafer. In step 16 (exposure), the circuit patterns of the mask are printed on the wafer by exposure suing the foregoing exposure apparatus. In step 17 (development), the exposed wafer is developed. In step 18 (etching), portions other than developed resist images are etched. In step 19 (resist stripping), the unnecessary resist after the etching is removed. By implementing these steps repeatedly, multiple circuit patterns are formed on the wafer. Since manufacturing equipment used in the respective steps is maintained by the remote maintenance system, it is possible to prevent occurrence of trouble and, even if trouble occurs, quick recovery is enabled, and therefore, it is possible to improve the productivity of the semiconductor devices as compared with conventional techniques.

Preferred modes of the present invention will be enumerated hereinbelow.

A chamber apparatus of the preferred mode is characterized by comprising a chamber for maintaining an environment different from an external environment, an external multiplex processing means for, outside the chamber, multiplexing a plurality of signals sent to the inside of the chamber or demultiplexing a multiplexed signal sent from the inside of the chamber, an internal multiplex processing means for, inside the chamber, multiplexing a plurality of signals sent to the outside of the chamber or demultiplexing a multiplexed signal sent from the outside of the chamber, a signal transmission line connecting between the external multiplex processing means and the internal multiplex processing means for transmitting the multiplexed signal, and a feedthrough portion for allowing the signal transmission line to extend between the inside and outside of the chamber.

Herein, the chamber may be, for example, a purge chamber filled with an inert gas inside, or a vacuum chamber. The multiplexing may be, for example, multiplexing by time division multiplex or wavelength division multiplex. The multiplexing may be carried out for all the signals or part of the signals. Each of the external multiplex processing means and the internal multiplex processing means may be, for example, a means using a multiplexer and a demultiplexer, or a means using an optical multiplexer/demultiplexer. The external multiplex processing means and the internal multiplex processing means for carrying out multiplexing outside the chamber and an internal processing means for carrying out demultiplexing inside the chamber, an internal multiplex processing means for carrying out multiplexing inside the chamber and an external processing means for carrying out demultiplexing outside the chamber, or an external multiplex processing means for carrying out multiplexing and demultiplexing outside the chamber and an internal multiplex processing means for carrying out demultiplexing and multiplexing inside the chamber. The signal transmission line may be, for example, a transmission line for an electrical signal or an optical fiber. The chamber apparatus may be, for example, one for an exposure apparatus or one for an etching apparatus.

In this structure, the plurality of signals sent to the inside of the chamber from the outside thereof are multiplexed together by the external multiplex processing means outside the chamber, sent to the inside of the chamber through the signal transmission line via the feedthrough portion, and demultiplexed by the internal multiplex processing means inside the chamber. Alternatively, the plurality of signals sent to the outside of the chamber from the inside thereof are multiplexed together by the internal multiplex processing means inside the chamber, sent to the outside of the chamber through the signal transmission line via the feedthrough portion, and demultiplexed by the external multiplex processing means outside the chamber. Therefore, the number of each of the signal transmission lines and feedthrough portions can be set to be smaller than the number of signals. For example, one signal transmission line and one feedthrough portion may be sufficient. Accordingly, it is possible to provide a chamber apparatus that can transmit more signals between the inside and outside of a chamber and is less affected by an outgas without causing an increase in size and price of the apparatus, and further to provide a semiconductor manufacturing apparatus using such a chamber apparatus.

In the preferred mode, the signal transmitted/received between the inside and outside of the chamber is an optical signal, and the signal transmission line is composed of an optical fiber. In this case, each of the external multiplex processing means and the internal multiplex processing means can be formed by an optical multiplexer/demultiplexer for wavelength multiplex communication.

Further, the chamber apparatus may have a plurality of sensors for detecting a predetermined state inside the chamber and sending detection signals to the outside of the chamber through the signal transmission line. Each sensor may be configured to return an optical signal having been sent to the inside of the chamber from the outside thereof, to the outside of the chamber as an optical signal having information about the presence or absence of a predetermined object in the chamber. Each sensor may be an encoder.

Furthermore, the chamber apparatus may be configured such that the X- and Y-stages are provided so as to be driven in the chamber, the encoders are for measuring the positions of the X- and Y-stages, and the X- and Y-stages are controlled by a control means provided outside the chamber on the basis of optical signals from the encoders.

A semiconductor manufacturing apparatus of the preferred mode is characterized by comprising the foregoing chamber apparatus. Further, a device manufacturing method of the preferred mode is characterized by manufacturing a device using such a semiconductor manufacturing apparatus.

Moreover, another device manufacturing method of the preferred mode is characterized by comprising a step of transmitting and receiving a plurality of signals related to device manufacture between the inside and outside of a chamber when manufacturing a device by the use of the chamber maintaining an environment different from an external environment, and a step of, when transmitting and receiving the plurality of signals, multiplexing the respective signals and then passing a multiplexed signal through a transmission line extending through a feedthrough portion of the chamber.

According to the foregoing preferred modes, in the chamber apparatus having the purge chamber filled with an inert gas inside or having the vacuum chamber under negative pressure inside, or the semiconductor manufacturing apparatus having such a chamber apparatus, the signals exchanged between the inside and outside of the chamber are first multiplexed together and then transmitted through the feedthrough portion so that the number of feedthrough portions can be reduced. Therefore, it is possible to contribute to a reduction in size and price of the chamber apparatus and the semiconductor manufacturing apparatus employing it. Further, it is possible to improve the yield of semiconductor devices that are manufactured by using the apparatus.

The present invention is not limited to the above embodiments and various changes and modifications can be made within the spirit and scope of the present invention. Therefore, to apprise the public of the scope of the present invention, the following claims are made.

What is claimed is:

1. A system including a chamber having an internal environment different from an external environment, the system comprising:
    a plurality of generators disposed outside of the chamber and each configured to generate a plurality of light waves;
    a transmission line disposed through a partition wall of the chamber and configured to transmit a light wave therethrough;
    a plurality of measurement units disposed inside of the chamber and each configured to direct a plurality of light waves to an associated measurement region and to receive a plurality of light waves from the associated measurement region;
    a first multiplexer/demultiplexer disposed outside of the chamber and configured (i) to multiplex a plurality of light waves generated by the plurality of generators to generate first multiplexed light waves, (ii) to send the first multiplexed light waves to the transmission line, and (iii) to demultiplex second multiplexed light waves received from the transmission line to generate first demultiplexed light waves;
    a second multiplexer/demultiplexer disposed inside of the chamber and configured (i) to demultiplex the first multiplexed light waves received from the transmission line to generate second demultiplexed light waves, (ii) to send the second demultiplexed light waves, as the plurality of light waves to be respectively directed by the plurality of measurement units to the regions, (iii) to multiplex the plurality of light waves respectively received by the plurality of measurement units from the regions, to generate the second multiplexed light waves, and (iv) to send the second multiplexed light waves to the first multiplexer/demultiplexer via the transmission line; and
    a plurality of signal processors disposed outside of the chamber and each configured to receive the first demultiplexed light waves that correspond to the plurality of light waves respectively received by the plurality of measurement units from the regions, and to perform respective signal processing for the measurements.

2. A system according to claim 1, wherein the light waves generated by the plurality of generators have wavelengths different from each other.

3. A system according to claim 1, wherein the transmission line includes an optical fiber.

4. A system according to claim 1, wherein one of the plurality of measurement units functions as a light-projecting portion and a light-receiving portion of a photointerrupter.

5. A system according to claim 1, wherein one of the plurality of measurement units functions as a light-projecting portion and a light-receiving portion of a position detector.

6. A system according to claim 1, further comprising a scale disposed in one of the regions.

7. A system according to claim 1, further comprising a controller disposed outside of the chamber configured to receive outputs from the plurality of signal processors.

8. A system according to claim 7, further comprising a to-be-controlled unit disposed inside the chamber, wherein the controller is configured to control the to-be-controlled unit based on the received outputs.

9. A system according to claim 8, wherein the to-be-controlled unit is a movable unit, and the controller is configured to control a position of the movable unit based on the received outputs from the plurality of signal processors.

* * * * *